US009316707B2

(12) United States Patent
Khalighi et al.

(10) Patent No.: US 9,316,707 B2
(45) Date of Patent: Apr. 19, 2016

(54) SYSTEM AND METHOD OF RECEIVE SENSITIVITY CORRECTION IN MR IMAGING

(75) Inventors: Mohammad Mehdi Khalighi, San Jose, CA (US); Brian Rutt, Stanford, CA (US)

(73) Assignee: General Electric Company, Schenectady, NY (US)

( * ) Notice: Subject to any disclaimer, the term of this patent is extended or adjusted under 35 U.S.C. 154(b) by 864 days.

(21) Appl. No.: 13/449,387

(22) Filed: Apr. 18, 2012

(65) Prior Publication Data

US 2013/0278255 A1    Oct. 24, 2013

(51) Int. Cl.
*G01R 33/24*    (2006.01)
*G01R 33/565*    (2006.01)

(52) U.S. Cl.
CPC .......... *G01R 33/246* (2013.01); *G01R 33/5659* (2013.01); *G01R 33/56563* (2013.01)

(58) Field of Classification Search
CPC ............. G01R 33/246; G01R 33/5659; G01R 33/56563
See application file for complete search history.

(56) References Cited

U.S. PATENT DOCUMENTS

| | | | |
|---|---|---|---|
| 7,375,523 B1 * | 5/2008 | Hancu | 324/307 |
| 2005/0256393 A1 * | 11/2005 | Deoni et al. | 600/410 |
| 2009/0206838 A1 * | 8/2009 | Noterdaeme et al. | 324/309 |
| 2010/0315084 A1 * | 12/2010 | Sacolick et al. | 324/309 |
| 2013/0249553 A1 * | 9/2013 | Simonetti et al. | 324/309 |

FOREIGN PATENT DOCUMENTS

| | | | | |
|---|---|---|---|---|
| WO | WO /2012/073159 | * | 11/2011 | G01R 33/54 |
| WO | WO/2012/073159 | * | 11/2011 | G01R 33/54 |

OTHER PUBLICATIONS

Wang et al., Measurement and Correction of Transmitter and ReceiverInduced Nonuniformities in Vivo, 2005, Magnetic Resonance in Medicine, 53:408-417.*

Belaroussi et al., "Intensity non-uniformity correction in MRI: Existing methods and their validation," Medical Image Analysis, vol. 10, 2006, pp, 234-246.

Watanabe et al., "Non-uniformity correction of human brain imaging at high field by RF field mapping of B1+ and B1−", Journal of Magnetic Resonance, vol. 212, 2011, pp. 426-430.

* cited by examiner

*Primary Examiner* — Dixomara Vargas

(57) ABSTRACT

A magnetic resonance imaging (MRI) apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, and a computer programmed to generate an original image of an object, generate a proton density weighted image of the object, generate a $B_1+$ field map of the object, generate a transmit-corrected image based on the $B_1+$ field map and based on the proton density weighted image, electronically filter the transmit-corrected image to generate a receive sensitivity map, and revise the original image using the receive sensitivity map.

20 Claims, 6 Drawing Sheets

SYSTEM AND METHOD OF RECEIVE SENSITIVITY CORRECTION IN MR IMAGING

BACKGROUND OF THE INVENTION

The present invention relates generally to medical imaging systems and, more particularly, to receive sensitivity correction in magnetic resonance imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (i.e., an excitation field referred to in the art as $B_1+$ and as opposed to a receive magnetic field known in the art as $B_1-$) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal $B_1+$ is terminated and this signal may be received as a $B_1-$ signal and processed to form an image.

When utilizing these signals to produce images, magnetic field gradients (Gx, Gy, and Gz) are employed. Typically, the region to be imaged is scanned by a sequence of measurement cycles in which these gradients vary according to the particular localization method being used. The resulting set of received nuclear magnetic resonance (NMR) signals are digitized and processed to reconstruct the image using one of many well known reconstruction techniques.

There are a variety of known techniques to determine if the $B_1+$ field produced by a magnetic resonance coil or array is homogeneous or to what degree the field is inhomogeneous. Such techniques are often referred to as $B_1+$ mapping (and is commonly referred to in the art as "$B_1$ mapping" without the "+" designator). In general, $B_1+$ mapping techniques may either implement spatially or non-spatially resolved $B_1+$ measurements. $B_1+$ measurements are spatially resolved if one or more spatial encoding gradients are applied during acquisition and, in contrast, $B_1+$ measurements are non-spatially resolved when spatial encoding gradients are not utilized during $B_1+$ measurements. Among other things, $B_1+$ maps can be used to adjust transmit gain to produce a radio frequency (RF) pulse at a specific flip angle or to design multi-transmit channel RF pulses, as examples. $B_1+$ mapping can also serve as an aide in T1 mapping and/or other quantitative MR imaging techniques. Some $B_1+$ mapping techniques are T1 dependent. That is, the signal utilized for $B_1+$ is often weighted as a function of T1 relaxation. Other $B_1+$ mapping techniques are $B_0$ or chemical shift dependent. Still other techniques are inaccurate over certain ranges of $B_1+$ field, and/or are dependent on large RF power depositions.

Thus, $B_1+$ mapping is employed in known techniques to account for and correct for transmit $B_1+$ field nonuniformity in MR imaging. However, in high field MR, such as 3T or higher, images are affected by both a transmit sensitivity (non-uniform $B_1+$) as well as a receive sensitivity ($B_1-$) at the same time. Both transmit and receive non-uniformity contribute to image artifacts that are not distinguishable or separable using known techniques in high field MR. As such, receive sensitivity correction methods often ignore the presence of a non-uniform B1+ field and assume a homogenous B1+ field. One known method estimates the receive sensitivity (B1−) using the transmit sensitivity (B1+), which typically only are used with transmit/receive (Tx/Rx) coils and not with receive only phase array coils.

It would therefore be desirable to have a system and apparatus that efficiently distinguishes and accounts for $B_1+$ and $B_1-$ fields of a magnetic resonance system.

BRIEF DESCRIPTION OF THE INVENTION

Embodiments of the invention provide a system, apparatus, and method for distinguishing $B_1+$ and $B_1-$ fields that overcome some or all the aforementioned drawbacks.

In accordance with one aspect of the invention, a magnetic resonance imaging (MRI) apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, and a computer programmed to generate an original image of an object, generate a proton density weighted image of the object, generate a $B_1+$ field map of the object, generate a transmit-corrected image based on the $B_1+$ field map and based on the proton density weighted image, electronically filter the transmit-corrected image to generate a receive sensitivity map, and revise the original image using the receive sensitivity map.

In accordance with another aspect of the invention, a method of magnetic resonance imaging (MRI) includes generating a proton density weighted image of an object, determining a transmit sensitivity map from a $B_1+$ field map of the object, generating a transmit-corrected image of the object based on the transmit sensitivity map and based on the proton density weighted image, low-pass filtering the transmit-corrected image to generate a receive sensitivity map, and correcting an MR image using the receive sensitivity map.

In accordance with yet another aspect of the invention, a computer readable storage medium having stored thereon a computer program comprising instructions, which, when executed by a computer, cause the computer to generate an original image of an object, obtain an MR image of an object, obtain a proton density weighted image of the object, obtain a $B_1+$ field map of the object, generate a transmit-corrected image based on the $B_1+$ field map and based on the proton density weighted image, electronically filter the transmit-corrected image to generate a receive sensitivity map, and refine the original image using the receive sensitivity map.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
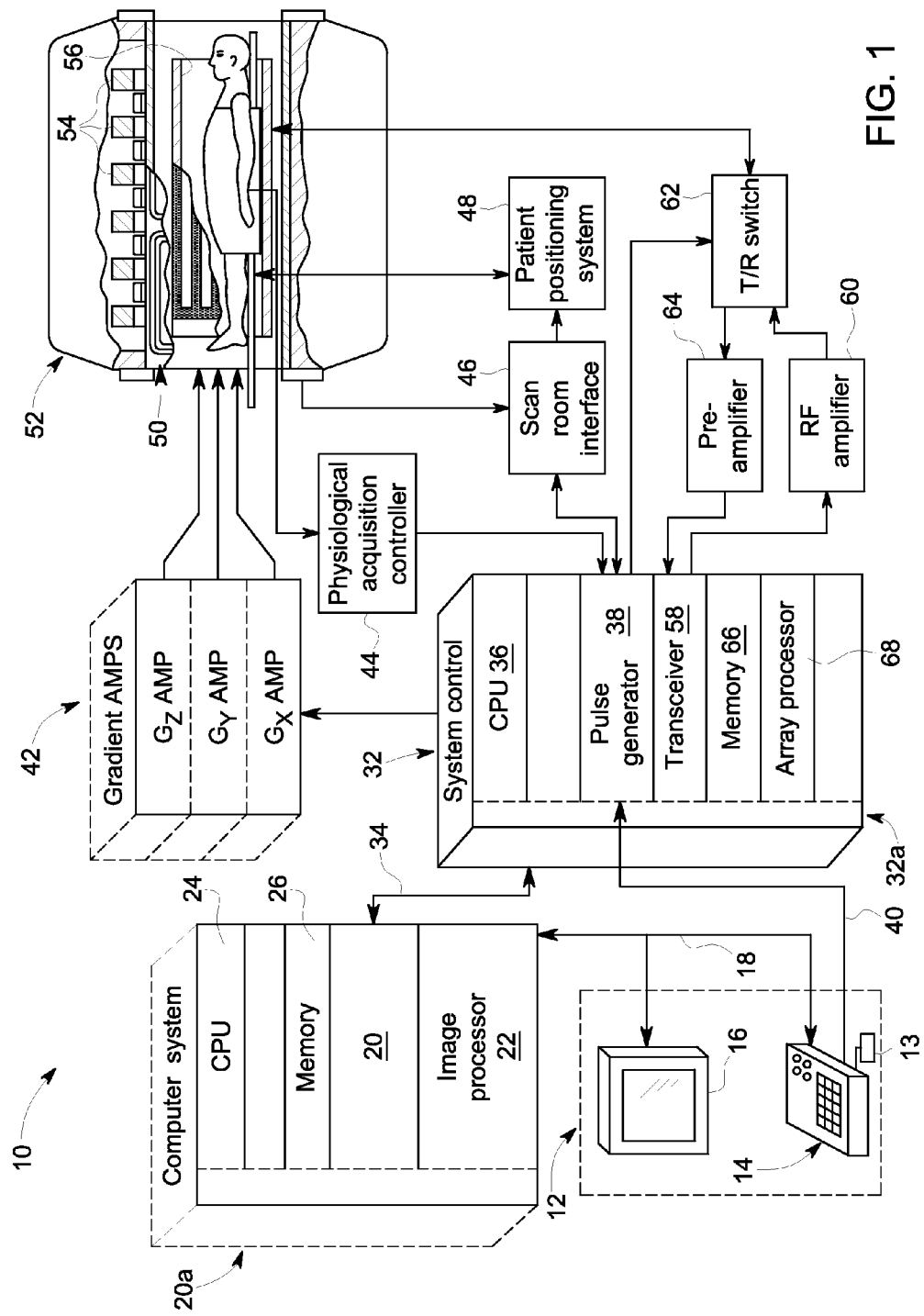
FIG. 1 is a schematic diagram of an exemplary MR imaging system for use with embodiments of the present invention.

Referring to FIG. 1, the major components of an exemplary magnetic resonance imaging (MRI) system 10 incorporating embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and one or more pulse generator modules 38 which connect to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. In an embodiment of the invention, RF coil 56 is a multi-channel coil. A transceiver module 58 in the system control 32 produces pulses which are amplified by one or more RF amplifiers 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. It is recognized that RF coil 56 or an array may take the form of a dedicated receive coil integrated into a patient table. Alternatively, it is also recognized that a separate RF coil (for example, a surface coil) or array may be enabled by transmit/receive switch 62 and may be used in addition to or in lieu of RF coil 56.

The MR signals picked up by the multi-channel RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
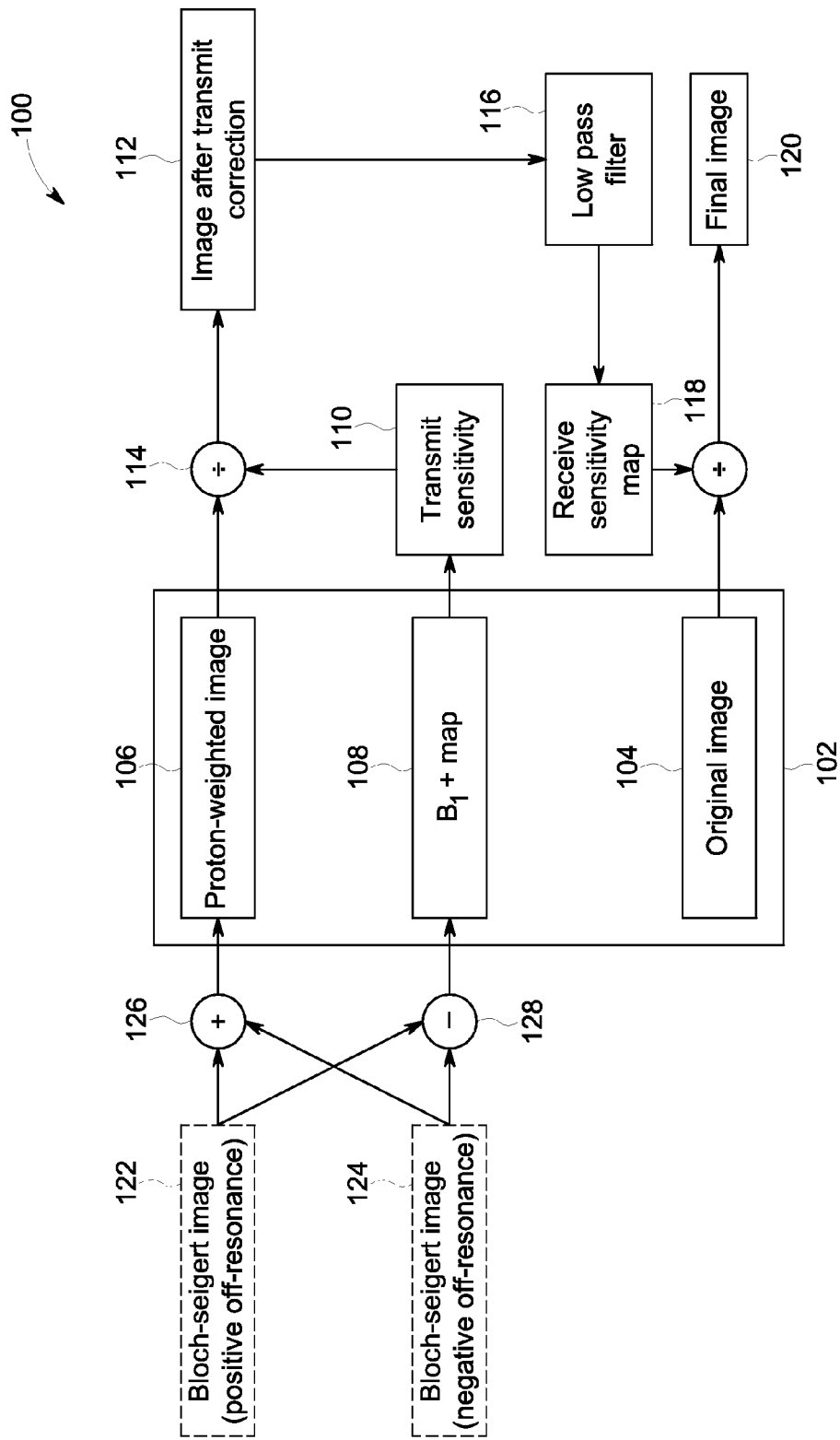
FIG. 2 is a flowchart illustrating steps for providing an MR image according to embodiments of the invention.

Referring to FIG. 2, a flowchart depicting a technique for mapping both transmit and receive sensitivities is illustrated, according to an embodiment of the invention. Technique 100 includes an overall initial block or step 102 that includes obtaining an original image 104 of a subject that will be transmit-sensitivity corrected and receive-sensitivity corrected, as will be further illustrated. Block or step 102 includes obtaining a proton-weighted image 106 and generation of a $B_1+$ map 108. Original image 104 is obtained using methods commonly known in the art and using MRI system 10 as described above. Proton-weighted image 106 and $B_1+$ map 108 are also obtained using methods that are known in the art. According to embodiments described below with respect to FIGS. 3-6, proton-weighted image 106 and $B_1+$ map 108 are obtained using a Bloch-Siegert (B-S) mapping method. However, as stated, most known receive sensitivity correction methods ignore the transmit sensitivity, but in high field MR such as 3T or higher, images are affected by both a transmit sensitivity (non-uniform $B_1+$) as well as a receive sensitivity ($B_1-$) at the same time. Thus, according to embodiments of the invention, technique 100 efficiently distinguishes a $B_1+$ and $B_1-$ fields of a magnetic resonance system.

For now it is assumed that proton-weighted image 106 and $B_1+$ map 108 are obtained using known B-S methods, and as stated, the methods used to obtain them will be described forthwith. That is, proton-weighted image 106 is a B-S magnitude signal that can be obtained using the techniques below described with respect to FIGS. 3-6. However, the invention is not to be so limited, and that other methods that can obtain proton-weighted image 106 and $B_1+$ map 108 are also contemplated. That is, although B-S methods are referred to hereinbelow, it is contemplated that any method that yields a proton-weighted image 106 and $B_1+$ map 108 may be further manipulated to correct for transmit sensitivity in an MR image, according to the invention.

The parameters of the B-S $B_1+$ mapping sequences are selected to generate a proton density weighted (PD) image. The signal equation for a spoiled gradient echo sequence is given by:

$$S_n = R_n M_0 \sin(\alpha) \frac{1 - E_1}{1 - E_1 \cos(\alpha)}; \quad \text{(Eqn. 1)}$$

where $S_n$ is the signal from the n-th coil, $R_n$ is the receive sensitivity of the n-th coil, $M_0$ is the proton density, $\alpha$ is the flip angle, and $E_1 = \exp(-TR/T_1)$. Assuming relatively long TR (repetition time) and small flip angle, $S_n \cong R_n M_0 \sin(\alpha)$.

The transmit sensitivity or sin(α) term can be measured by the B-S $B_1+$ mapping method. The receive sensitivity $R_n$ and the proton density $M_0$ are assumed to be separable in the spatial frequency domain with $R_n$ dominating the low spatial frequency range and $M_0$ dominating the high spatial frequency range. As such, a heavily low-pass-filtered version of $R_n M_0$ provides a good approximation to the pure receive sensitivity, $R_n$.

As such, referring still to FIG. 2, the B-S-derived $B_1+$ map is used estimate the transmit sensitivity at step 110. That is, the transmit sensitivity is determined at each voxel using the signal equation (Eqn. 1) derived at step 108. At step 112 a transmit-corrected image is generated by dividing out 114 the transmit sensitivity. The image is low pass filtered 116 (having a cutoff frequency of approximately $\sigma=0.4$ cm$^{-1}$ in one embodiment) to remove proton density contrast, yielding a receive sensitivity map 118. Thus, by first dividing out the transmit sensitivity obtained at step 110 and then low-pass filtering at step 116, the receive sensitivity at step 118 is accordingly isolated and is applied to original image 104 to yield a final image 120. According to one embodiment, the final receive sensitivity of the combined or final image 120 is produced by a sum-of-squares over all channels, which is then interpolated over a 3D volume and used for intensity correction of target CUBE images. According to an exemplary embodiment, CUBE images are acquired having a FOV of 22 cm, 0.1 mm isotropic resolution, TR=3500 ms, and TE of 89 ms. These receive sensitivity maps could also be used for image reconstruction of images acquired by phased array coils or used for aliasing correction in accelerated imaging such as SENSE or ASSET.

As stated, step 102 of technique 100 includes obtaining an original image 104, obtaining a proton-weighted image 106, and generating a $B_1+$ map at step 108. As also stated, various B-S techniques are known in the art that can be used to generate the proton-weighted image 106 and the $B_1+$ map 108. Thus, FIGS. 3-6 illustrate techniques employable for this purpose, according to the invention. That is, FIGS. 3-6 illustrate techniques, each of which may be used, to generate proton-weighted image 106 and $B_1+$ map 108, which may then be used beginning in block 102 according to the invention.

Figure 3:
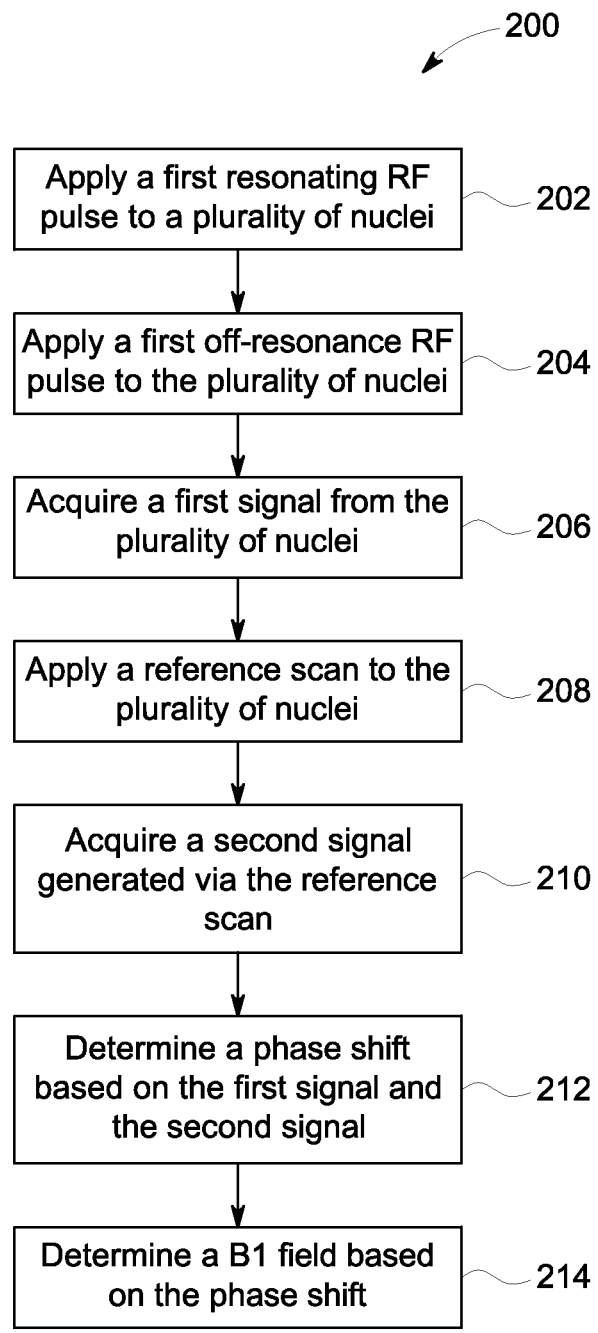
FIGS. 3-6 are flowcharts depicting techniques for determining a $B_1+$ field and a proton weighted image.

Referring to FIG. 3, a flowchart depicting a technique 200 for determining a $B_1+$ field of a magnetic resonance coil or array according to an embodiment of the invention is shown. Technique 200 begins at block 202, where a first resonating RF pulse is applied to a plurality of nuclei. A resonating RF pulse is an RF pulse tuned to a resonant frequency of a plurality of nuclei subjected to a magnetic field. As such, the application of a resonating RF pulse places the nuclei in an excited state. The parameters of the resonating RF pulses are chosen so that the resulting image will be proton density weighted. After application of the first resonating RF pulse, a first off-resonance RF pulse is applied to the plurality of excited nuclei at block 204. An off-resonance RF pulse is an RF pulse tuned such that application of the off-resonance RF pulse to a plurality of nuclei does not place the plurality of nuclei in an excited state. For example, an off-resonance RF pulse is an RF pulse having a particular shape or frequency such that the application thereof to a plurality of nuclei subjected to a magnetic field will not be excited, or will be excited to a minimal extent.

The application of this first off-resonance RF pulse occurs while the plurality of nuclei are already in an excited state. The application of the first off-resonance RF pulse causes the resonance frequency of the plurality of excited nuclei to shift. Such a shift is often referred to as a Bloch-Siegert (B-S) shift. The magnitude of such a shift is dependent on the $B_1+$ field applied to the plurality of excited nuclei.

After application of the first off-resonance RF pulse, a first signal is acquired from the plurality of shifted nuclei at block 206. Proceeding to block 208, a reference scan is applied to again excite the plurality of nuclei. The reference scan includes at least one resonating RF pulse. However, in this embodiment, the reference scan does not include an off-resonance RF pulse. A signal generated via the reference scan is acquired at block 210. That is, a second or additional signal is acquired at block 210. As depicted in the flowchart of FIG. 3, the reference scan and the acquisition of the second signal occur after acquisition of the first signal. However, it is contemplated that in an alternate embodiment, the reference scan and the acquisition of the additional signal may occur prior to the application of the first resonating RF pulse at block 202.

Proceeding to block 212, a phase shift is determined based on the first and second acquired signals. The phase associated with the first signal is the sum of transmit phase, $\phi$, the receive phase, $\phi_{Rx}$, the $B_0$ phase, $\phi_{B0}$, additional sequence-related phase $\phi_{Seq}$ and the B-S phase, $\phi_{BS}$. The B-S phase may be represented in the following manner:

$$\varphi_{BS} = \int_0^T \frac{\gamma(B_1+)^2(t)}{2(\Delta\omega_{RF}(t) + \Delta\omega_{B0})},, \quad \text{(Eqn. 2)}$$

where $B_1+$ represents the magnetic field associated with the RF coil or array, $\Delta\omega_{B0}$ represents frequency associated with $B_0$ inhomogeneity and/or chemical shift, and $\Delta\omega_{RF}$ represents the difference between the frequency of the off-resonance RF pulse and the frequency of the resonating RF pulse, where the resonating RF pulse is considered to be at the resonance frequency of the spin system.

As such, the phase, $\phi_1$, associated with the first signal can be represented in the following manner:

$$\phi_1 = (\phi_{Tx} + \phi_{Rx} + \phi_{B0} + \phi_{Seq}) + \phi_{BS} \quad \text{(Eqn. 3).}$$

The phase of the second signal, since an off-resonance pulse was not played out prior to the acquisition thereof, is not dependent on $\phi_{BS}$. That is, the phase of the second signal is the sum of transmit phase, $\phi_{Tx}$, the receive phase, $\phi_{Rx}$, and $B_0$ phase, $\phi_{B0}$. Accordingly, the phase, $\phi_2$, associated with the second signal can be represented in the following manner:

$$\phi_2 = (\phi_{Tx} + \phi_{Rx} + \phi_{B0} + \phi_{Seq}) \quad \text{(Eqn. 4).}$$

In one embodiment, the phase difference between the first and second signal determines the phase shift. That is:

$$\phi_1 - \phi_2 = \phi_{BS} \quad \text{(Eqn. 5).}$$

After determining the phase shift, process control proceeds to block 214, and a $B_1+$ field is determined based on the phase shift. According to one embodiment, the following relationship is used to determine the $B_1+$ field:

$$B_{1,peak} += \sqrt{\frac{\varphi_{BS}}{\int_0^T \frac{\gamma(B_{1,normalized}+)(t)}{2(\Delta\omega_{RF}(t) + \Delta\omega_{B0})} dt}},, \quad \text{(Eqn. 6)}$$

where $B_{1\text{-}normalized}+$, is the off-resonance pulse shape, normalized so that the highest point of the pulse shape=1. $B_{1\text{-}normalized}+$ can be considered to equal or substantially equal $B_1+(t)/B_{1,peak}+$. $B_1+(t)$ represents the of the off-resonance pulse as a function of time and $B_{1,peak}+$ represents the maximum of $B_{1,peak}+$ (i.e., the magnitude of the off-resonance RF field at the highest point of the RF pulse, and $\Delta\omega_{RF}(t)$ represents the offset frequency of the RF pulse as a function of time. That is, $\Delta\omega_{RF}(t)$ represents the difference between the resonating RF pulse and the off-resonance RF pulse, or effectively the difference between the frequency of the resonating spin system and the off-resonance RF pulse. $\omega_{B0}$ represents an additional frequency offset from resonance due to $B_0$ field inhomogeneity and/or chemical shift. $B_{1,peak}+$ represents the maximum or substantially maximum value of $B_1+(t)$ (i.e., the magnitude of the RF field at the highest or substantially highest point if the off-resonance RF pulse).

Figure 4:
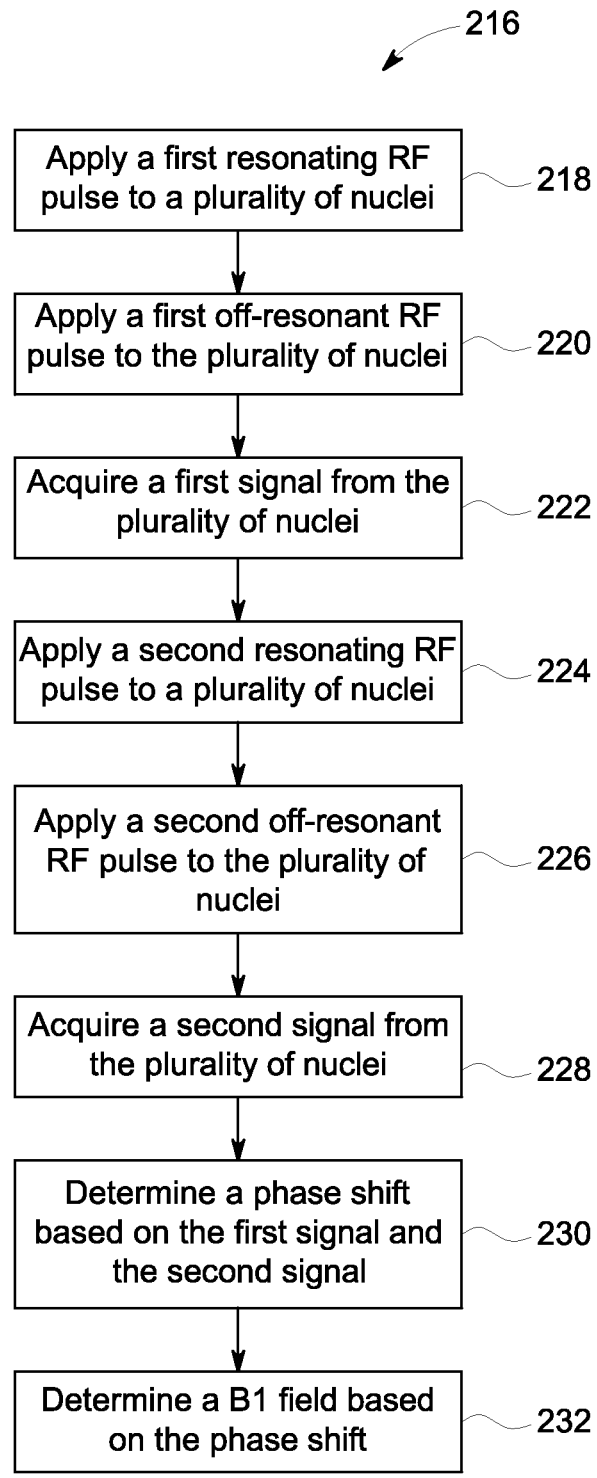

Referring now to FIG. 4, a flowchart depicting a technique 216 for determining a $B_1+$ field of a magnetic resonance coil or array according to another embodiment of the invention is shown. Technique 216 begins at block 218, where a first resonating RF pulse is applied to a plurality of nuclei. As discussed above with respect to FIG. 3, a resonating RF pulse is an RF pulse, which when applied to a plurality of nuclei excites the plurality of nuclei, causing them to precess at their resonant frequency. Though not shown in FIG. 4, it is contemplated that one or more RF pulses or pre-pulses may be played out prior to application of the first resonating RF pulse. After application of the first resonating RF pulse, a first off-resonance RF pulse is applied to the plurality of excited nuclei at block 220. In other words, the first off-resonance pulse is applied to the excited nuclei.

The application of the off-resonance pulse to the excited nuclei shifts the resonating frequency of the excited nuclei. As discussed above with respect to FIG. 3, an off-resonant RF pulse is an RF pulse that avoids or at least substantially avoids exciting the plurality of nuclei. As such, the frequency profile of an off-resonance RF pulse is chosen such that on-resonance excitation of the plurality of nuclei from such a pulse is avoided or at least substantially avoided.

Referring back to FIG. 4, in one embodiment, the first off-resonance RF pulse is a Fermi RF pulse at a first frequency other than the resonating frequency of the plurality of nuclei. It is noted, however, that rather than utilizing a Fermi pulse, other embodiments may utilize a resonating RF pulse different than a Fermi RF pulse. After application of the first off-resonance RF pulse, a first signal is acquired from the plurality of nuclei at block 222. It is contemplated that the first signal may be acquired as one or more spatial encoding gradients are played out, thus allowing for acquisition of 1D, 2D, or 3D image data.

After acquisition of the first signal, process control proceeds to block 224, where a second resonating RF pulse is applied to the plurality of nuclei. The application of the second resonating RF pulse causes the plurality of nuclei to re-excite. It is contemplated that one or more RF pulses or pre-pulses may precede the application of the second resonating RF pulse.

After application of the second resonating RF pulse, process control proceeds to block 226, where a second off-resonance RF pulse is applied to the plurality of excited nuclei. Like the first off-resonance RF pulse, the second off-resonance RF pulse has a frequency profile that avoids or at least substantially avoids resonating the plurality of nuclei, but rather shifts the resonating frequency of the plurality of nuclei. In the present embodiment, the second off-resonance RF pulse is at a second frequency that is different than the frequency of the first off-resonance RF pulse (i.e., the first frequency). A second signal is then acquired at block 228, after the application of the second off-resonance RF pulse.

It is contemplated that the application of the first resonating RF pulse, the application of the first off-resonance RF pulse, the acquisition of the first signal, the application of the second resonating RF pulse, the application of the second off-resonance RF pulse, and the acquisition of the second signal may occur during the same scan having any chosen repetition time (TR). It is also contemplated that such a scan may be an imaging scan. In such an instance, one or more spatial encoding gradients would be played out during acquisition of the first and second signals. As such, $B_1+$ field information and imaging information is gathered during each acquisition (e.g., during acquisition of the first and second signals). The TR, the flip angles of the resonating RF pulses, and other parameters of an imaging sequence may be chosen to comport with any type of imaging sequence. For example, embodiments of the invention may incorporate spin echo, gradient echo, and echo planar-type imaging sequences. In addition, the parameters of the off-resonance RF pulse may be arbitrarily chosen as long as the RF pulse avoids or substantially avoids resonating the nuclei subjected to the magnetic fields.

It is also contemplated that each resonating RF pulse (i.e., the first and second resonating RF pulses) may be applied during a separate scan. For example, the application of the first resonating RF pulse, the first off-resonance RF pulse, and the acquisition of the first signal may occur during a first scan. In such an instance, the application of the second resonating RF pulse, the second off-resonance RF pulse, and the acquisition of the second signal may occur during a later or second scan. Additionally, spatial encoding gradients may be played out during the acquisition of the first and/or second signals.

Still referring to FIG. 4, after the second signal is acquired, process control proceeds to block 230, where a phase shift is determined based on the acquired first and second signals. According to one embodiment, a phase difference between the first and second signals is used to determine the phase shift.

According to such an embodiment, the phase difference between the first and second signals is determined by first converting the first and second signals to phase image data sets (i.e., a first phase image data set and a second phase image data set). The phase of each phase image data set corresponds to a combination of at least the transmit phase, $\phi_{Tx}$, the receive phase, $\phi_{Rx}$, the $B_0$ phase, $\phi_{B0}$, sequence phase $\phi_{Seq}$ and the B-S phase, $\phi_{BS}$. The phase difference between the two scans resulting from the B-S shift may be represented as follows:

$$\Delta\varphi_{BS} = \int_0^T \frac{\gamma(B_1+)(t)}{2(\omega_{RF1}(t) + \omega_{B0})} - \int_0^T \frac{\gamma(B_1+)(t)}{2(\omega_{RF2}(t) + \omega_{B0})}, \quad \text{(Eqn. 7)}$$

where $\Delta\phi_{BS}$ is the B-S phase difference between the two scans. $\omega_{RF}$ represents the offset frequency of the off-resonance RF pulse frequency. In other words, $\phi_{RF1}$ represents the frequency difference between the resonance frequency of the spin system, and the first off-resonance RF pulse. $\omega_{RF2}$ represents the frequency difference between the resonance frequency of the spin system, and the second off-resonance RF pulse. To continue, $\gamma$ represents the gyromagnetic ratio and $(B_1+)(t)$ represents the RF field of the off-resonance RF pulse, and $\omega_{B0}$ represents the frequency offset from resonance due to $B_0$ field inhomogeneity and/or chemical shift.

Further, if the first and second off-resonance RF pulses are configured to be applied on opposite sides of the spin resonance peak, in other words one off-resonance pulse at higher, and one at lower frequency than the spin resonance, B0-inhomogeneity and chemical shift dependence of the B-S shift is greatly decreased. Here $\Delta\omega_{RF}$ is the average frequency offset of the two off-resonance pulse frequencies: $\Delta\omega_{RF}=(\Delta\omega_{RF1}-\Delta\omega_{RF2})/2$.

$$\Delta\varphi_{BS} \approx \int_0^T \frac{\gamma(B_1+)(t)}{\Delta\omega_{RF}(t)}. \quad \text{(Eqn. 8)}$$

Similarly, the $\omega_{B0}$ dependent term of Eqn. 7 may also be avoided entirely if the offset of the first off-resonance frequency and the offset of the second off-resonance frequency are symmetric (e.g., $\omega_{RF1}=-\omega_{RF2}$, equivalently $+/-\omega_{RF}$ frequencies). That is, if the first off-resonance RF pulse is at a first frequency where the offset is $+\omega_{RF}$ and the second off-resonance RF pulse is a second frequency where the offset is $-\omega_{RF}$, transmit phases, receive phases, other sequence related phases, and phase shifts from off-resonance $B_0$ that are the same in both phase image data sets will be removed during subtraction. As such, a value of the B-S phase difference between the two signals, $\Delta\omega_{BS}$, that is dependent on the $B_1$ field and $\omega_{RF}$, but $B_0$ independent, is determined by Eqn. 7.

After determining the phase shift, process control proceeds to block 232, where a $B_1+$ field is determined. The $B_1+$ field determination is based on the previously determined Bloch-Siegert phase shift. In one embodiment, in cases where $\omega_{B0}$ can be disregarded, the $B_1+$ field is represented in the following manner:

$$B_{1,peak} += \sqrt{\frac{\Delta\varphi_{BS}}{\int_0^T \frac{\gamma(B_{1,normalized}+)(t)}{\omega_{RF}(t)} dt}}. \quad \text{(Eqn. 9)}$$

As one skilled in the art will appreciate, Eqn. 9 is effectively Eqn. 8 rewritten to solve for $B_1+$. Accordingly, based on the first and second signals, $B_{1,peak}+$ may be determined.

Figure 5:
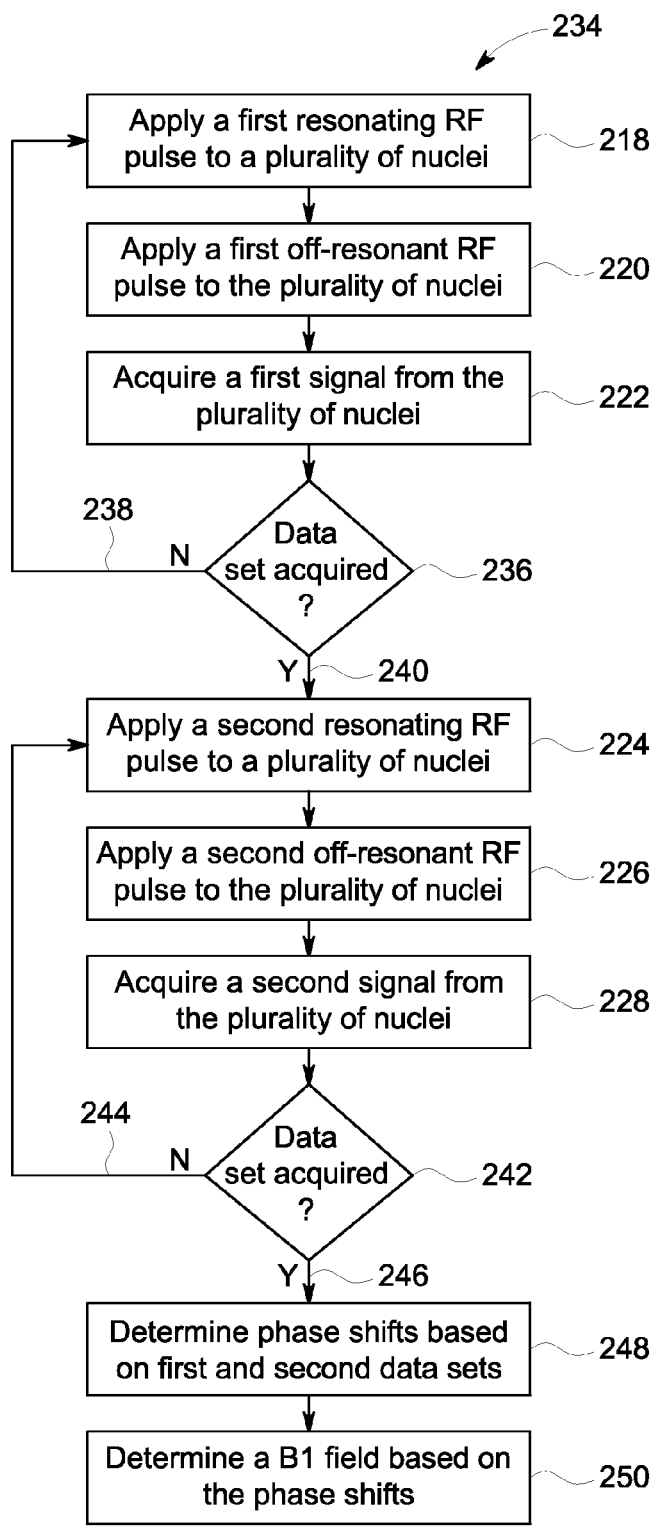

Referring now to FIG. 5, a flowchart depicting a technique 234 for determining a $B_1+$ field of a magnetic resonance coil or array according to another embodiment of the invention is shown. Technique 234 is similar to technique 216. However, after acquisition of the first signal at block 222, process control proceeds to decision block 236, where it is determined if a first data set is acquired. The first data set may include two or more lines of k-space or one or more lines of multiple k-spaces. It is also contemplated that first data set may include one or more image data sets. Whether or not the first data set includes k-space data or image data, the first data set includes information from more than one signal. If it is determined that the first data set is not acquired 238, process control proceeds to block 218, and the first resonating frequency is once again applied to re-excite the plurality of nuclei. It is contemplated that one or more RF pulses or pre-pulses may precede the application of the first resonating RF pulse. In addition, the parameters of the first resonating RF pulse may be different from the parameters of the previously applied first resonating RF pulse. Likewise, the parameters of the first off-resonance RF pulse may be different from the parameters of the previously applied off-resonance pulse.

If, on the other hand, it determined that the first data set is acquired 240, process control proceeds to block 224, where a second resonating RF pulse is applied to excite the plurality of nuclei. It is contemplated that one or more RF pulses or pre-pulses may precede the application of the second resonating RF pulse.

In a similar manner, after acquiring the second signal at block 228, process control proceeds to decision block 242, where it is determined if a second data set has been acquired. Similar to first data set, second data set may include more than one line of a single k-space or the second data set may include one or more lines of multiple k-spaces. Additionally, the second data set may include image data for one more image data sets. If it is determined that the second data set is not acquired 244, process control proceeds to block 224, where the second resonating RF pulse is applied to re-excite the plurality of nuclei. Again, it is contemplated that one or more RF pulses or pre-pulse may be applied prior to application of the second resonating RF pulse.

In addition, the parameters of the presently applied second resonating RF pulse may be different from the parameters of the previously applied second resonating RF pulse. Likewise, the parameters of the second off-resonant RF pulse may also change among applications.

If, on the other hand, it is determined that the second data set is acquired 246, process control proceeds to block 248, where phase shifts based on the first and second data sets are determined. Phase shifts may be determined in a manner similar to that as described above with respect to FIG. 4, utilizing Eqns. 7-9. However, rather than determining a single phase shift, multiple phase shifts are determined based on the multiple signals acquired. Process control then proceeds to block 250, and a $B_1$ field or field map is determined based on the phase shifts. According to one embodiment, the relationship of Eqn. 9 is used to determine the $B_1$ field map that embodies $B_1$ field inhomogeneities associated with the MR imaging coil(s).

Figure 6:
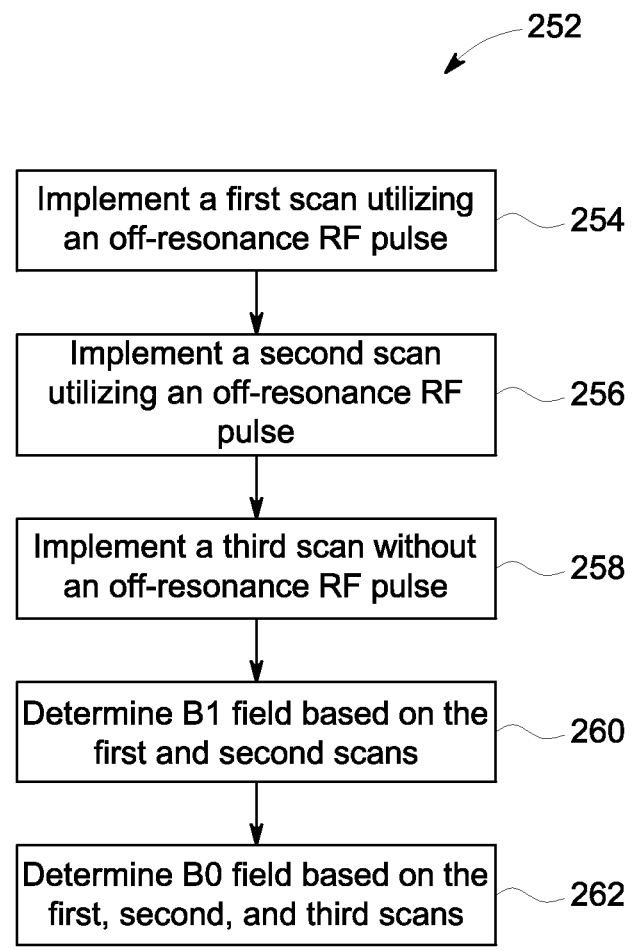

Referring now to FIG. 6, a flowchart depicting a technique 252 for simultaneously determining a $B_1+$ and $B_0$ field is shown according to an embodiment of the invention. Technique 252 begins at block 254, where a first scan utilizing an off-resonance RF pulse is implemented. In other words, a first scan, which may be an imaging scan, is implemented that utilizes at least one resonating RF pulse, at least one off-resonance RF pulse, and at least on signal acquisition that follows application of the off-resonance RF pulse. Process control then proceeds to block 256, where a second scan utilizing an off-resonating RF pulse is implemented. Similar to the first scan, the second scan includes at least one resonating RF pulse and at least one off-resonance pulse to shift the resonating frequency of the nuclei. The resonant frequency shift is followed by at least one signal acquisition.

After implementation of the second scan, process control proceeds to block 258, where a third scan that does not utilize an off-resonance RF pulse is implemented. The third scan utilizes at least one resonating RF pulse and at least one signal acquisition. However, the third scan does not utilize an off-resonance RF pulse to shift the resonating frequency of the plurality of nuclei subjected to the magnetic fields. It is contemplated that, in an alternate embodiment, the third scan is implemented prior to the first scan, between the first and second scans, or interleaved with the first and or second scans.

Referring back to the present embodiment, process control proceeds to block 260 after implementation of the third scan, and a $B_1+$ field is determined based on the first and second scan. In one embodiment, the phase difference between the phase of the first scan, $\phi_1$, and the phase of the second scan, $\phi_2$, is used to determine the $B_1+$ field. For example, as discussed above with respect to FIGS. 3-4, a phase gathered from a scan can be represented by at least the sum of the transmit phase, $\phi_{Tx}$, receive phase, $\phi_{Rx}$, $B_0$ phase, $\phi_{B0}$, sequence phase, $\phi_{Seq}$, and B-S phase. Where $\omega_{B0} \ll \omega_{RF}$, the B-S phase described by Eqn. 2 can be approximated by Taylor expansion by the following relationship:

$$\varphi_{BS} \approx \int_0^T \frac{\gamma B_1^2(t)}{2\omega_{RF}(t)} - \int_0^T \frac{\gamma B_1^2 \omega_{B0}}{2\omega_{RF}^2}. \quad \text{(Eqn. 10)}$$

This splits the B-S phase shift into two terms: one $\omega_{B0}$-dependent and one $\omega_{B0}$-independent.

$$\varphi_{BS} = \varphi\left(\frac{\gamma B_1^2}{\Delta\omega_{RF}}\right) - \varphi\left(\frac{\gamma B_1^2 \Delta\omega_{B0}}{2\Delta\omega_{RF}^2}\right), \quad \text{(Eqn. 11)}$$

where:

$$\varphi\left(\frac{\gamma B_1^2}{2\Delta\omega_{RF}}\right) = \int_0^T \frac{\gamma B_1^2(t)}{2\omega_{RF}(t)}, \varphi\left(\frac{\gamma B_1^2 \Delta\omega_{B0}}{2\Delta\omega_{RF}^2}\right) = \int_0^T \frac{\gamma B_1^2 \Delta\omega_{B0}}{2\Delta\omega_{RF}^2}. \quad \text{(Eqn. 12)}$$

Accordingly, the phase of the first scan can be represented as follows:

$$\phi_1 = (\phi_{Tx} + \phi_{Rx} + \phi_{B0} + \phi_{Seq}) + \varphi\left(\frac{\gamma B_1^2}{2\Delta\omega_{RF}}\right) - \varphi\left(\frac{\gamma B_1^2}{2\Delta\omega_{RF}^2}\right). \quad \text{(Eqn. 13)}$$

Next, if $-\Delta\omega_{RF}$ is implemented in the second scan, the phase of the second scan can be represented as follows:

$$\phi_2 = (\phi_{Tx} + \phi_{Rx} + \phi_{B0} + \phi_{Seq}) - \varphi\left(\frac{\gamma B_1^2}{2\Delta\omega_{RF}}\right) - \varphi\left(\frac{\gamma B_1^2 \Delta\omega_{B0}}{2\Delta\omega_{RF}^2}\right). \quad \text{(Eqn. 14)}$$

If RF excitation is applied at frequencies symmetrically around the water resonance peak, the $B_1$ field can be determined in a $B_0$ independent manner from the phase difference between the first scan and the second scan. That is, $\phi_1 - \phi_2 \Rightarrow B_1$.

After determining the $B_1$ field, process control proceeds to block 262, where a $B_0$ field based on the first, second, and third scans is determined. Since the third scan was implemented without using an off-resonance RF pulse to shift the resonating frequency of the nuclei subjected to the imaging, the phase of the third scan can be represented in the following manner:

$$\phi_3 = (\phi_{Tx} + \phi_{Rx} + \phi_{B0} + \phi_{Seq}) \quad \text{(Eqn. 15)}.$$

Accordingly, the $B_0$ field may be determined from the phase difference between the third scan and the first and second scans (i.e., $2\phi_3 - (\phi_1 + \phi_2) \Rightarrow B_0$). For nonsymmetric RF frequency offsets (i.e., $\Delta\omega_{RF1} \approx \Delta\omega_{RF2}$), $B_1$ and $B_0$ can still be determined by solving the system of equations defined by Eqn. 11, where $\Delta\omega_{RF} = \Delta\omega_{RF1}$, Eqn. 11 where $\Delta\omega_{RF} = \Delta\omega_{RF2}$, and Eqn. 13.

Thus, in summary, technique 100 includes a B-S method that is used for measuring both transmit and receive sensitivities. The imaging parameters of the B-S method are selected to generate a proton density image. It is assumed that the proton density contrast contains high spatial frequencies that can be separated from the receive sensitivity by low-pass filtering. The receive sensitivities, which are obtained for each individual channel can be used for image reconstruction in parallel imaging in addition to intensity correction. Technique 100 will achieve receive sensitivity correction but the transmit inhomogeneity will remain in the final image. If the signal equation of the final image is known, the transmit sensitivity may be obtained from $B_1+$ maps and consequently corrected, but in some cases the signal equation is dependent on tissue properties such as T1 (longitudinal relaxation time) or T2 (transverse relaxation time), which may not be available. Alternatively, parallel transmit or $B_1-$ insensitive sequences can be used to create a uniform transmit field.

Referring now back to FIG. 2, as stated step 102 of technique 100 includes obtaining an original image 104, obtaining a proton-weighted image 106, and generating a $B_1+$ map at step 108. As also stated and as discussed with respect to FIGS. 3-6 above, various B-S techniques are known in the art that can be used to generate the proton-weighted image 106 and the $B_1+$ map 108. Thus, B-S techniques described therein may be used to generate proton-weighted image 106, and generating a $B_1+$ map at step 108, as is known in the art.

According to one embodiment of the invention, therefore, proton-weighted image 106, and $B_1+$ map 108 may be generated from a single B-S image. However, according to another embodiment of the invention, two off-resonant B-S images may be used to generated proton-weighted image 106 and generating a $B_1+$ map at step 108 in order to improve signal-to-noise ratio (SNR). For instance, as stated above in regard to FIG. 4, first and second off-resonance RF pulses may be applied on opposite sides of the spin resonance peak, yielding two images per slice with the Bloch-Siegert pulse at +/−off-resonance frequency. In such an embodiment in which the B-S sequence applies first and second off-resonance RF pulses on opposite sides of the spin resonance peak, resultant positive and negative B-S images corresponding to $+/-\omega_{RF}$ frequencies may be utilized to improve the SNR. Thus, FIG. 2 illustrates optional steps 122, 124 which may be combined, as known in the art, to generate proton-weighted image 106 and $B_1+$ map at step 108. That is, steps 122, 124 are illustrated as optional, having the understanding that, according to embodiments of the invention, a B-S technique may be applied in which two B-S images are first generated, or a single B-S image is first generated, depending on which B-S technique is utilized.

Further, images generated at steps 122, 124 are added 126 to generate the proton density weighted image, and images generated at steps 122, 124 are subtracted 128, in the example illustrated, as known in the art. A scaled phase different between image pairs will generate the $B_1+$ map for a respective slice, and the $B_1+$ map is independent of receive sensitivity. The $B_1+$ map is used to estimate the transmit sensitivity at each voxel using the signal equation for the Bloch-Siegert magnitude signal, as discussed above. The Bloch-Siegert magnitude image is processed by dividing out the transmit sensitivity, yielding an image with a product of receive sensitivity and proton density. The proton density is assumed to consist primarily of relatively high spatial frequencies (i.e., is uniform if averaged over a sufficiently large spatial region), while the receive sensitivity map consists of relatively low spatial frequencies (which will not be significantly affected by low-pass filtering). After low pass filtering, a receive sensitivity map is revealed, which is used to correct the original image.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

A technical contribution for the disclosed method and apparatus is that it provides for a processor implemented receive sensitivity correction in MR imaging.

In accordance with one embodiment, a magnetic resonance imaging (MRI) apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, and a computer programmed to generate an original image of an object, generate a proton density weighted image of the object, generate a $B_1+$ field map of the object, generate a transmit-corrected image based on the $B_1+$ field map and based on the proton density weighted image, electronically filter the transmit-corrected image to generate a receive sensitivity map, and revise the original image using the receive sensitivity map.

In accordance with another embodiment, a method of magnetic resonance imaging (MRI) includes generating a proton density weighted image of an object, determining a transmit sensitivity map from a $B_1+$ field map of the object, generating a transmit-corrected image of the object based on the transmit sensitivity map and based on the proton density weighted image, low-pass filtering the transmit-corrected image to generate a receive sensitivity map, and correcting an MR image using the receive sensitivity map.

In accordance with yet another embodiment, a computer readable storage medium having stored thereon a computer program comprising instructions, which, when executed by a computer, cause the computer to generate an original image of an object, obtain an MR image of an object, obtain a proton density weighted image of the object, obtain a $B_1+$ field map of the object, generate a transmit-corrected image based on the $B_1+$ field map and based on the proton density weighted image, electronically filter the transmit-corrected image to generate a receive sensitivity map, and refine the original image using the receive sensitivity map.

The present invention has been described in terms of the preferred embodiment, and it is recognized that equivalents, alternatives, and modifications, aside from those expressly stated, are possible and within the scope of the appending claims.

What is claimed is:

1. A magnetic resonance imaging (MRI) apparatus comprising:

a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and a computer programmed to:
  generate an original image of an object;
  generate a proton density weighted image of the object;
  generate a $B_1+$ field map of the object;
  generate a transmit-corrected image based on the $B_1+$ field map and based on the proton density weighted image;
  electronically filter the transmit-corrected image to generate a receive sensitivity map; and
  revise the original image using the receive sensitivity map to yield a final image.

2. The MRI apparatus of claim 1 wherein the computer is programmed to calculate a transmit sensitivity at each voxel of the $B_1+$ field map based on a signal equation for a Bloch-Siegert (B-S) magnitude signal, and generate the transmit-corrected image using the transmit sensitivity.

3. The MRI apparatus of claim 2 wherein the signal equation is given by:

$$S_n = R_n M_0 \sin(\alpha) \frac{1-E_1}{1-E_1\cos(\alpha)},$$

where $S_n$ is a signal from an n-th coil, $R_n$ is a receive sensitivity of the n-th coil, $M_0$ is a proton density, $\alpha$ is a flip angle, and $E_1=\exp(-TR/T1)$, wherein TR is a repetition time and T1 is a time constant pertaining to longitudinal relaxation.

4. The MRI apparatus of claim 2 wherein the signal equation is given by $S_n=R_n M_0 \sin(\alpha)$, where $S_n$ is a signal from an n-th coil, $R_n$ is a receive sensitivity of the n-th coil, $M_0$ is a proton density, $\alpha$ is a flip angle.

5. The MRI apparatus of claim 1 wherein the computer is programmed to execute a B-S sequence to generate the proton density weighted image and to generate the $B_1+$ field map of the object.

6. The MRI apparatus of claim 5 wherein the computer is programmed to execute the B-S sequence and generate the proton density weighted image from a single B-S image derived therefrom.

7. The MRI apparatus of claim 5 wherein the computer is programmed to:
  execute the B-S sequence by being programmed to obtain a positive off-resonance B-S image and a negative off-resonance B-S image;
  combine the positive and the negative off-resonance B-S images to generate the proton density weighted image; and
  combine the positive and negative off-resonance B-S images to generate the $B_1+$ field map.

8. The MRI apparatus of claim 1 wherein the computer is programmed to:
  electronically filter the transmit-corrected image by low-pass filtering the transmit-corrected image having a cut-off frequency of $\sigma=0.4$ cm$^{-1}$.

9. A method of magnetic resonance imaging (MRI) comprising:
  generating a proton density weighted image of an object;
  determining a transmit sensitivity map from a $B_1+$ field map of the object;

generating a transmit-corrected image of the object based on the transmit sensitivity map and based on the proton density weighted image;

low-pass filtering the transmit-corrected image to generate a receive sensitivity map; and correcting an MR image using the receive sensitivity map to yield a final image.

10. The method of claim 9 comprising generating the $B_1+$ field map of the object and generating a proton weighted image of the object using a Bloch-Siegert (B-S) mapping sequence.

11. The method of claim 10 wherein using the B-S mapping sequence comprises obtaining a positive off-resonance B-S image and a negative off-resonance B-S image; and further comprises:

combining the positive and the negative off-resonance B-S images to generate the proton density weighted image; and generating the $B_1+$ field map from the positive and the negative off-resonance B-S images.

12. The method of claim 9 wherein determining the transmit sensitivity map comprises calculating a transmit sensitivity at each voxel of the $B_1+$ field map based on a signal equation for a B-S magnitude signal.

13. The method of claim 9 wherein low-pass filtering the transmit-corrected image comprises electronically filtering the transmit-corrected image using a cutoff frequency of $\sigma=0.4$ cm$^{-1}$.

14. A non-transitory computer readable storage medium having stored thereon a computer program comprising instructions, which, when executed by a computer, cause the computer to:

generate an original image of an object;

obtain an MR image of an object;

obtain a proton density weighted image of the object;

obtain a $B_1+$ field map of the object;

generate a transmit-corrected image based on the $B_1+$ field map and based on the proton density weighted image;

electronically filter the transmit-corrected image to generate a receive sensitivity map; and refine the original image using the receive sensitivity map to generate a final image having reduced image artifacts.

15. The non-transitory computer readable storage medium of claim 14 wherein the computer is programmed to control a magnetic resonance imaging (MRI) system in order to:

generate the MR image of the object; and execute a Bloch-Siegert (B-S) sequence in order to:
generate the proton density weighted image; and
generate the $B_1+$ field map.

16. The non-transitory computer readable storage medium of claim 15 wherein the computer is programmed to:

execute the B-S sequence by being programmed to obtain a positive off-resonance B-S image and a negative off-resonance B-S image;

derive the proton density weighted image from the positive and the negative off-resonance B-S images; and derive the $B_1+$ field map from the positive and negative off-resonance B-S images.

17. The non-transitory computer readable storage medium of claim 16 wherein the proton density weighted image is an average of the positive and negative off-resonance B-S images.

18. The non-transitory computer readable storage medium of claim 14 wherein the computer is programmed to calculate a transmit sensitivity at each voxel of the $B_1+$ field map based on a signal equation for a Bloch-Siegert (B-S) magnitude signal.

19. The non-transitory computer readable storage medium of claim 18 wherein the signal equation is given by $S_n=R_n M_0 \sin(\alpha)$, where $S_n$ is a signal from an n-th coil, $R_n$ is a receive sensitivity of the n-th coil, $M_0$ is a proton density, $\alpha$ is a flip angle.

20. The non-transitory computer readable storage medium of claim 14 wherein the computer is programmed to electronically filter the transmit-corrected image by low-pass filtering the transmit-corrected image having a cutoff frequency of $\sigma=0.4$ cm$^{-1}$.

* * * * *